United States Patent
Willing et al.

(10) Patent No.: US 7,940,532 B2
(45) Date of Patent: May 10, 2011

(54) POWER CONVERSION DEVICE FRAME PACKAGING APPARATUS AND METHODS

(75) Inventors: Steven Lee Willing, Encinitas, CA (US); Kent Carlson, Allentown, PA (US); Robert E. Campbell, Colorado Springs, CO (US); Alberto Avendano, Anaheim, CA (US)

(73) Assignee: PEI-Genesis, Inc., Philadelphia, PA (US)

( * ) Notice: Subject to any disclaimer, the term of this patent is extended or adjusted under 35 U.S.C. 154(b) by 266 days.

(21) Appl. No.: 12/114,255

(22) Filed: May 2, 2008

(65) Prior Publication Data

US 2009/0091897 A1    Apr. 9, 2009

Related U.S. Application Data

(63) Continuation-in-part of application No. 11/820,476, filed on Jun. 18, 2007, now abandoned, and a continuation of application No. 11/075,539, filed on Mar. 9, 2005, now abandoned.

(60) Provisional application No. 60/551,915, filed on Mar. 10, 2004.

(51) Int. Cl.
   *H05K 7/14* (2006.01)
(52) U.S. Cl. ........ 361/807; 361/809; 361/752; 361/808; 361/728; 174/520
(58) Field of Classification Search .................. 361/752, 361/753, 799, 788, 807, 808, 809, 816, 818, 361/728; 174/520
See application file for complete search history.

(56) References Cited

U.S. PATENT DOCUMENTS

| | | | |
|---|---|---|---|
| 4,027,206 A | 5/1977 | Lee | |
| 4,498,123 A | 2/1985 | Fuss et al. | |
| 4,510,552 A | 4/1985 | Kanno | |
| 4,519,015 A | 5/1985 | Lin | |
| 4,625,259 A | 11/1986 | Krechmer et al. | |
| 4,639,834 A | 1/1987 | Mayer | |
| 4,808,115 A | 2/1989 | Norton et al. | |
| 4,858,070 A | 8/1989 | Buron et al. | |
| 4,899,254 A | 2/1990 | Ferchau et al. | |
| 4,908,738 A | 3/1990 | Kobari et al. | |
| 4,967,311 A | 10/1990 | Ferchau et al. | |
| 5,016,139 A | 5/1991 | Stopa et al. | |
| 5,099,391 A | 3/1992 | Maggelet et al. | |
| 5,119,286 A | 6/1992 | Huss et al. | |
| 5,157,590 A | 10/1992 | Barthel et al. | |
| 5,390,081 A | 2/1995 | St. Pierre | |
| 5,406,456 A | 4/1995 | Hsu | |
| 5,497,289 A | 3/1996 | Sugishima et al. | |
| 5,617,299 A | 4/1997 | Knoop et al. | |
| 5,673,173 A * | 9/1997 | Tsai ........................ | 361/679.43 |
| 5,680,294 A | 10/1997 | Stora et al. | |

(Continued)

*Primary Examiner* — Dameon E Levi
(74) *Attorney, Agent, or Firm* — Fox Rothschild LLP; Charles N. Quinn

(57) ABSTRACT

The present invention relates, generally, to electrical power conversion devices and to the universal packaging of those devices for a wide range of applications yielding cost efficient inventory management of product lines consisting of a group of power conversion devices each with minor variations. More specifically, the present invention relates to a universal mounting frame for receiving a printed circuit board in a switch mode power supply. The universal frame is adapted for receiving an open frame or printed circuit board and securing the open frame within a plurality of known packaging configurations. To this end, only a single size printed circuit board is necessary for any type of switch mode power supply configurations, thereby, reducing costs associated with manufacture and testing.

22 Claims, 12 Drawing Sheets

U.S. PATENT DOCUMENTS

| | | | |
|---|---|---|---|
| 5,757,638 A | 5/1998 | Katooka et al. | |
| 5,801,924 A | 9/1998 | Salmonson | |
| 5,835,350 A | 11/1998 | Stevens | |
| 5,870,284 A | 2/1999 | Stewart et al. | |
| 5,872,332 A * | 2/1999 | Verma | 174/386 |
| 5,886,874 A | 3/1999 | Onoda et al. | |
| 5,926,373 A | 7/1999 | Stevens | |
| 5,930,112 A | 7/1999 | Babinski et al. | |
| 5,940,288 A | 8/1999 | Kociecki | |
| 5,973,923 A | 10/1999 | Jitaru | |
| 5,995,380 A | 11/1999 | Maue et al. | |
| 6,005,775 A | 12/1999 | Chiu | |
| 6,046,921 A | 4/2000 | Tracewell et al. | |
| 6,215,664 B1 | 4/2001 | Hernandez et al. | |
| D442,913 S | 5/2001 | Nagahara et al. | |
| D442,914 S | 5/2001 | Nagahara et al. | |
| 6,266,247 B1 | 7/2001 | Stockwell et al. | |
| 6,278,609 B1 | 8/2001 | Suzuki et al. | |
| 6,459,586 B1 | 10/2002 | Miller et al. | |
| D465,199 S | 11/2002 | Tomioka | |
| 6,549,409 B1 | 4/2003 | Saxelby, Jr. et al. | |
| 6,563,713 B2 | 5/2003 | Yang | |
| D478,309 S | 8/2003 | Nagahara et al. | |
| 6,665,179 B2 | 12/2003 | Chou | |
| 6,693,799 B2 | 2/2004 | Gough et al. | |
| 6,724,639 B2 | 4/2004 | Tsai et al. | |
| 6,742,068 B2 | 5/2004 | Gallagher et al. | |
| 6,743,304 B2 | 6/2004 | Kawamata et al. | |
| 6,778,404 B1 | 8/2004 | Bolken et al. | |
| 6,778,405 B2 | 8/2004 | Boylan et al. | |
| 6,797,880 B2 | 9/2004 | Kirchberger et al. | |
| 7,477,528 B2 * | 1/2009 | Kim | 361/825 |
| 2002/0195262 A1 | 12/2002 | Kirchberger et al. | |
| 2002/0196614 A1 | 12/2002 | DiBene, II et al. | |
| 2004/0042179 A1 | 3/2004 | Murphy | |

\* cited by examiner

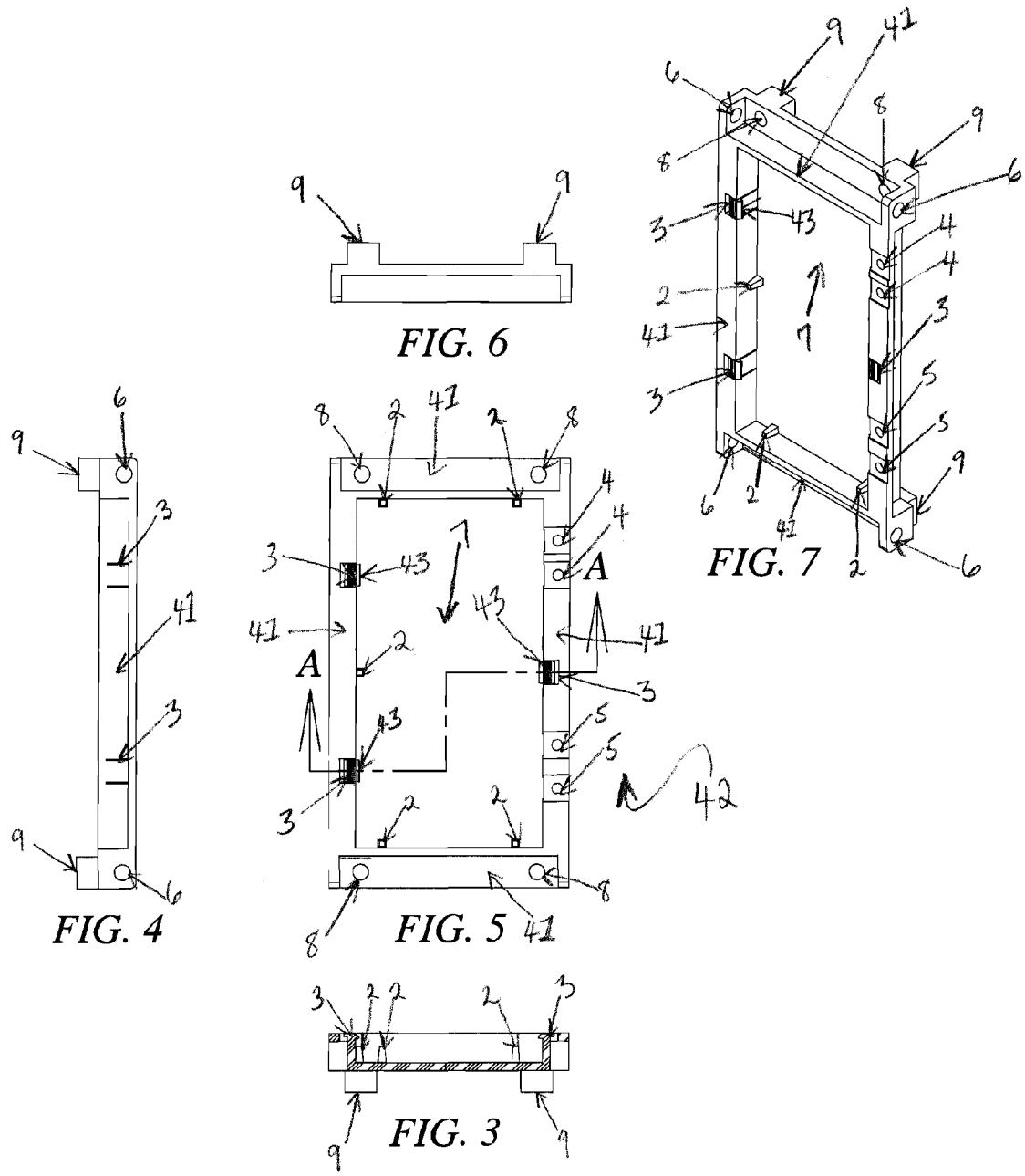

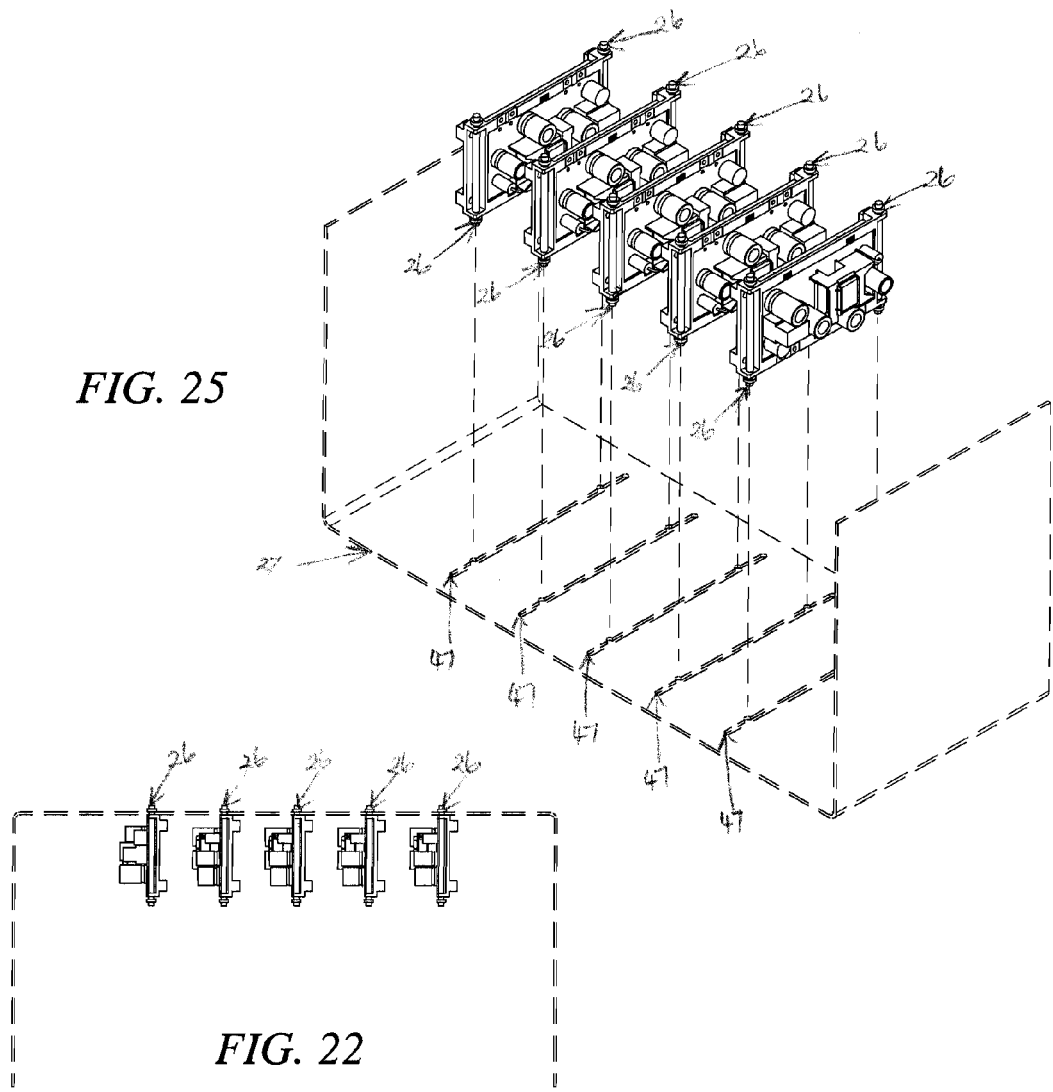
FIG. 25
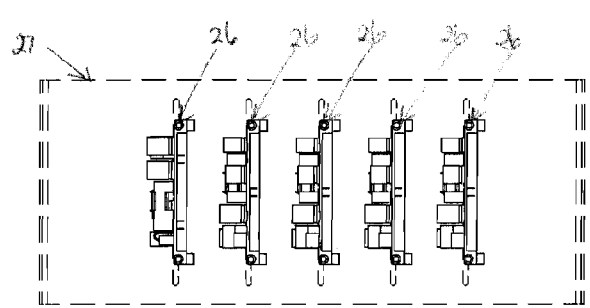
FIG. 22
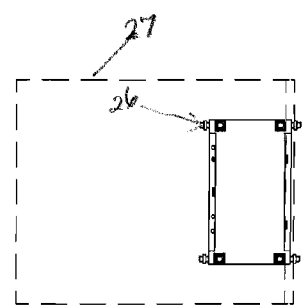
FIG. 23
FIG. 24

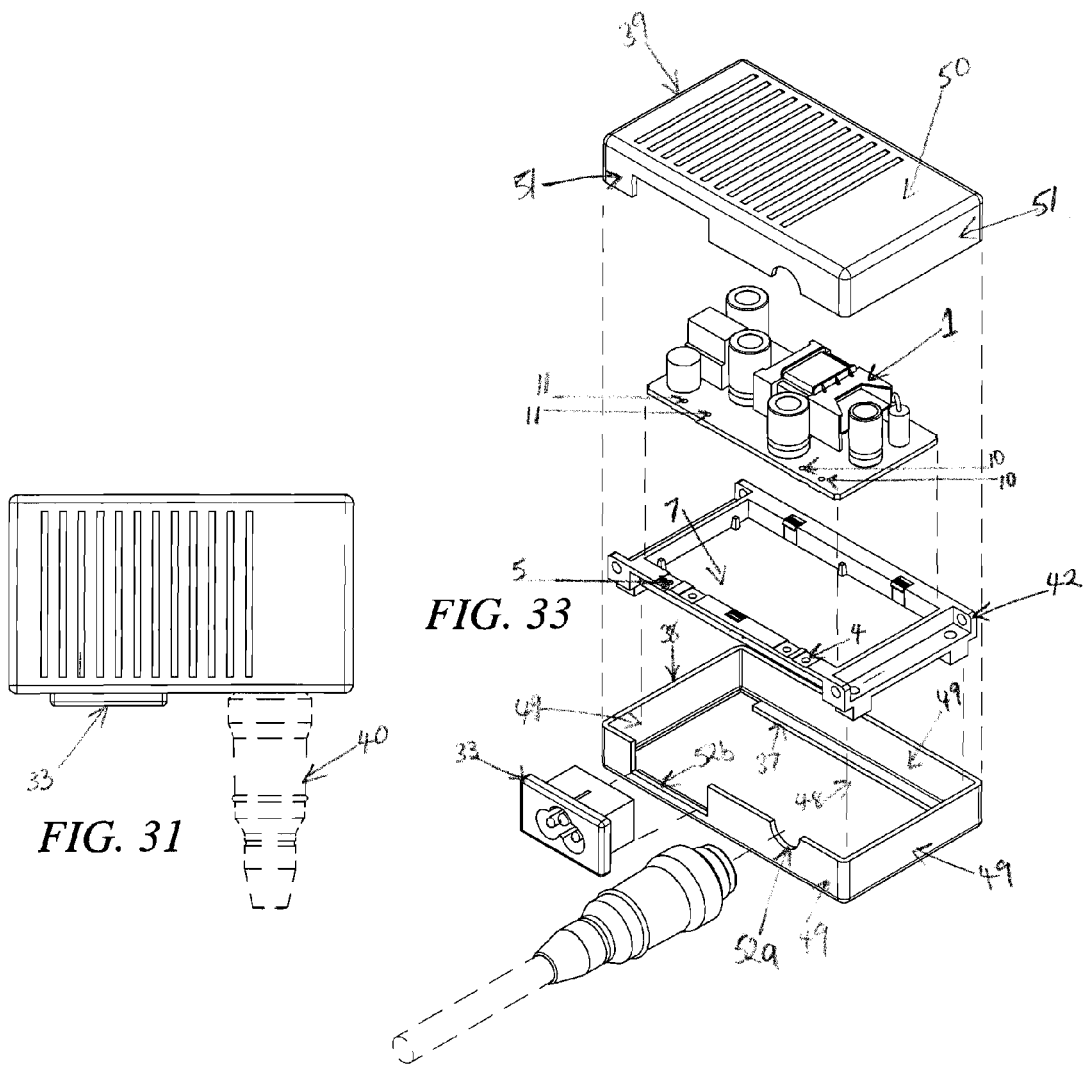
FIG. 33
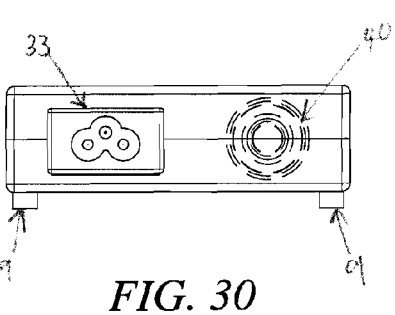
FIG. 31
FIG. 30
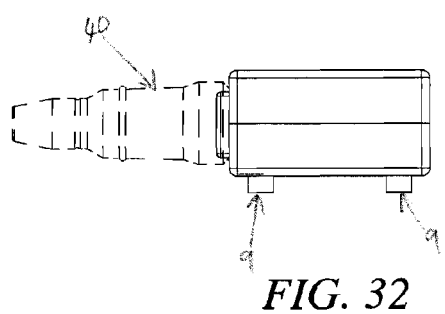
FIG. 32

POWER CONVERSION DEVICE FRAME PACKAGING APPARATUS AND METHODS

CROSS-REFERENCE TO RELATED PATENT APPLICATIONS

This patent application is a continuation-in-part of U.S. patent application Ser. No. 11/820,476, filed Jun. 18, 2007, which is a continuation of U.S. patent application Ser. No. 11/075,539, filed 9 Mar. 2005, (now abandoned) which claims the benefit, under the applicable provisions of 35 U.S.C. 119 and 120, of the priority of U.S. provisional patent application Ser. No. 60/551,915, entitled "Frame Packaging System for Power Conversion Devices, filed 10 Mar. 2004, the disclosure of which is hereby incorporated by reference in its entirety.

FIELD OF THE INVENTION

The present invention relates, generally, to electrical power conversion devices and more specifically to the packaging of those devices for a wide range of applications as well as for cost efficient inventory management of product lines consisting of a group of power conversion devices each with minor variations.

BACKGROUND

Switch mode power supplies are widely used in a variety of applications to convert alternating current (AC) electricity to one or more electrically isolated direct current (DC) outputs. The technology used for switch mode designs has improved substantially over the past decade allowing for smaller and more efficient designs. As design footprints have shrunk and power conversion efficiency has improved, many new packaging options have become feasible. Power supply customers are, consequently, demanding an ever increasing array of packaging and mounting options. These options include, but are not limited to, open frame packaging, cage frame packaging, U-channel packaging, table top/desk top packaging, wall mount packaging, module packaging, din rail packaging, chassis mount packaging, and rack mount packaging.

An open frame is comprised of simply a rectangular printed circuit board containing power supply circuitry. The board typically contains a plurality of mounting holes, preferably, at each corner of the board. The mounting holes provide a means to directly mount the board to the desired chassis or packaging configuration. In some embodiments, one or more studs or stand-offs are integrally formed with the chassis so as to facilitate mounting the printed circuit board within the chassis of electrical equipment.

The foregoing open frame may be coupled to a cage frame or a Faraday cage. A Faraday cage is an enclosure formed by conducting material, preferably a metallic material, that is used to shield external static electrical fields from a power supply. With printed circuit boards, Faraday cages are used to screen out electromagnetic interference generated by the power supply associated with the board. Typically, the Faraday cage is sized to fits over an open frame power supply, when the open frame is mounted in accordance with the above.

An open frame may also be mounted within a U-channel type package or configuration. U-channel packaging is typically comprised of a "U" shaped metal frame adapted to receive a printed circuit board. This metal frame is usually a single solid frame with a plurality of mounting holes contained at its periphery. In many cases, the frame is used to provide an electrical ground plane beneath the power supply. It is also often used as a heat sink for the power supply.

A printed circuit board may also be provided within an enclosure for a table top or desktop packaging. Table top or desktop packaging is typically comprised of a plastic enclosure containing a printed circuit board or open frame with an AC cable or connector on an input side of the enclosure and an DC cable or connector on the output side of the enclosure. A typical application is the external power supply for a notebook or laptop computer. By removing the power supply from the computer, the computer designer can create a smaller computer, can separate the computer from the heat and electromagnetic interference created by the power supply, and can simplify re-design cycles since the AC to DC conversion device does not have to be included in the safety approval process for the computer.

The open frame may also be mounted within a wall mount. A wall mount is and an external power supply designed for mounting directly on an AC outlet. To this end the wall mount converts the AC current of an electrical outlet to DC current that may be used in the accompanying device.

Similar to the wall mount is a module. A module is a power supply packaged for mounting directly on a printed circuit board. It typically has metal posts designed to be soldered directly to a printed circuit board. This approach is often used for power converters that adjust from one DC voltage to one or more lower DC voltages. It is also used for small AC to DC converters.

An open frame may also be mounted on a DIN rail. Although not limited thereto, a DIN rails is typically a standardized 35 mm wide metal rail with hat-shaped cross section. It is widely used for mounting circuit breakers and industrial control equipment inside equipment racks.

A chassis mount and a rack mount are types of mounts for open frames that are usually within a cabinet or other similar enclosure. Both structures are similar in that they are typically comprised of a flat metal sheet secured within the cabinet or similar enclosure wherein the flat sheet has a plurality of grooves or cutouts adapted to receive the open frame.

In addition to the basic packaging styles described above, there are many other options available. Most of these relate to different ways to remove heat, connect to or from the power supply, or reduce electromagnetic interference.

A key consequence of the variety of packaging options above is that there are often multiple versions of the power supply circuit reproduced on similar, but different, printed circuit boards. Each board is specifically designed to fit into one particular package or mounting configuration such that the open frames are not interchangeable between different configurations. While this will tend to optimize the design of each particular power supply and package combination, it greatly adds to the cost and complexity of a product line. In addition to the increased cost to design and produce multiple circuit boards, this approach adds cost and complexity since each printed circuit board must be designed, tested, and approved by the appropriate safety agencies. Finally, multiple versions of the printed circuit board also increases distribution costs since many similar parts must be held in inventory to fully stock the distribution channel.

Accordingly, a design is needed within the art for manufacturing a packaging frame than may be utilized in any of the foregoing packaging configurations. Such a design would have an equivalent optimization of design across each packaging structure, while reducing the cost and complexity of variations within the product lines. More importantly, costs will be further reduced because of the decreased need for producing multiple circuit boards for each particular use.

The present invention address the foregoing needs.

SUMMARY OF THE INVENTION

This invention seeks to overcome these problems by standardizing the dimensions and interconnection options on a printed circuit board (PCB) and by developing standardized mounting frames and packages. This system will enable a switch mode power supply (SMPS) to be packaged as either an open frame, side mounted open frame, rack or rail mounted frame, table top, wall mounted power supply, or the like. Rather than redesign the printed circuit board with different mounting characteristics for each packaging option, the present invention proposes a standardized printed circuit board and a plastic frame that will act as an adapter to convert the mounting, interconnection, electrical isolation, heat removal and/or electromagnetic shielding of the overall power supply.

At its core, the present invention is comprised of a frame. The frame is comprised of a base with at least four walls that are sized to receive a printed circuit board. A plurality of mounting studs and either a plurality of clips or a enclosing lid are couplable to the frame so as to secure the printed circuit board therein. The frame may contain at least one AC input connector and at least one DC output connector for providing an optional method of securing an external AC input means and DC output means, respectively, to the frame. The AC input connector is preferably in close proximity with an AC input contact secured to the printed circuit board. Similarly, the DC output connector is in close proximity to the DC output contact secured to the printed circuit board.

Extending from opposing ends of the frame is a coupling extension. The coupling extension contains one or more vertical and horizontal mounting holes therethrough wherein the mounting holes are adapted to secure the frame to any one of the switch mode power supply configurations discussed herein. The coupling extension also includes a plurality of leg-like standoffs that extend from an underside of the extension wherein the vertical though holes of the extension assembly pass through the standoffs. In one embodiment, the plurality of horizontal holes are adapted to secure the frame and printed circuit board to a chassis or rack using a coupling mechanism, e.g. screw. Alternatively, the horizontal holes may be equipped with a mounting stud extending therethough wherein the mounting stud is adapted to secure the frame and printed circuit board within one or more grooves of a chassis or rack. In an even further alternative embodiment, the vertical holes may also be adapted to secure the frame and printed circuit board to a chassis or rack using a coupling mechanism. In this embodiment, the standoffs also provide a means for maintaining space between the frame and the chassis or rack.

The frame of the present invention may be manufactured by any method known in the art. Most preferably, however, the present invention is manufactured utilizing an injection molding process wherein the walls of the frame may be directly molded to the printed circuit board. To this end, the frame is tailored to fit the accompanying circuit board.

As discussed further herein, the foregoing frame may be universal and interchangeable with any switch mode power supply known in the art. In one embodiment, the frame and printed circuit board may be received within a chassis, panel or rail of a known switch mode power supply casing. In other embodiments, the frame of the present invention may be received and secured within a desk top, wall mounted packages, or other module package.

In a even further embodiment, the frame of the present invention may be adapted to replace a portion of a casing for a switch mode power supply. More specifically, the frame may be comprised of the four walls and a bottom and is adapted to receive the printed circuit board in accordance with the foregoing. The printed circuit board may be placed into electrical communication with an AC input means and a DC output means by any method understood in the art. The frame may also be adapted to receive a lid or top half so as to substantially encase the printed circuit board therewithin. This application, while applicable to any of the embodiments discussed herein, is most preferred for wall mounted designs and desktop designs of the present invention.

From a supply chain management point of view, the present invention increases the flexibility of the product. Most notably, a single PCB can be packaged in many different ways. The PCB and packages can be manufactured in large volumes at a remote location and held in stock at a distribution location close to the market. When a customer places an order the power supply can be quickly packaged and shipped to the customer. This approach will result in fast response to customers with minimum inventory investments.

BRIEF DESCRIPTION OF THE DRAWINGS

FIG. 3 is a cross sectional side elevation view of the mounting frame taken along the line A-A of FIG. 5.

FIG. 4 is a side elevation view of the Mounting Frame, showing the side with mounting holes.

FIG. 5 is a front elevation view of the Mounting Frame, showing the retention clips mounting holes, mechanical support and AC-DC metal clips position.

FIG. 6 is a top elevation view of the Mounting Frame.

FIG. 7 is a perspective view of the Mounting Frame, illustrating the complete mounting detail feature.

FIG. 22 is a top elevation view of multiple PSUs mounted in a chassis, showing the PSUs and Mounting Frame mounted on one side.

FIG. 23 is a front elevation view of multiple PSUs mounted in a chassis, showing the PSUs and Mounting Frame stock in vertical position.

FIG. 24 is a side elevation view of multiple PSUs mounted in a chassis, showing the bottom part of the Mounting Frame.

FIG. 25 is a perspective view of multiple PSUs and a chassis, showing the layer arrangement of PSUs and Mounting Frame mounted on one side.

FIG. 30 is a front elevation view of a plastic enclosure that contains a PSU, showing the AC input and DC output installed in one side.

FIG. 31 is a top elevation view of a plastic enclosure that contains a PSU, showing the alignment of AC and DC component FIG. 32 is a side elevation view of a plastic enclosure that contains a PSU.

FIG. 33 is a perspective view of a plastic enclosure, a Mounting Frame and SMPS, showing the mounting techniques and arrangement of the PSU and the Mounting Frame into the base enclosure.

DETAILED DESCRIPTION OF THE INVENTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

The present invention relates, generally, to electrical power conversion devices and to the universal packaging of those devices for a wide range of applications yielding cost efficient inventory management of product lines consisting of a group of power conversion devices each with minor variations. More specifically, the present invention relates to a universal mounting frame for receiving a printed circuit board in a switch mode power supply. The universal frame is adapted for receiving an open frame or printed circuit board and securing the open frame within a plurality of known packaging configurations. To this end, only a single size printed circuit board is necessary for any type of switch mode power supply configurations, thereby, reducing costs associated with manufacture and testing.

Referring to FIGS. 1-7, a mounting frame 42 for receiving a printed circuit board 1 of a switch mode power supply is shown. The mounting frame 42 provides both mechanical support for the printed circuit board (PCB) 1 and electrical isolation beneath the PCB. More specifically, the mounting frame 1 is preferably comprised of at least four walls 41. As illustrated in FIG. 5, the four walls may be interconnected or integrally molded together such that the four walls 41 form a substantially rectangular frame with an opening passing therethrough. The opening is preferably sized to receive the PCB 1 and provide the necessary connections to achieve the switch mode power supply. To this end, the size of the opening passing through the walls of the frame is approximately the same as the perimeter of the PCB 1. Although not limited thereto, the four walls 41 of the mounting frame 42 may be comprised of a plastic or other similar natural or synthetic polymeric material.

Figure 1:
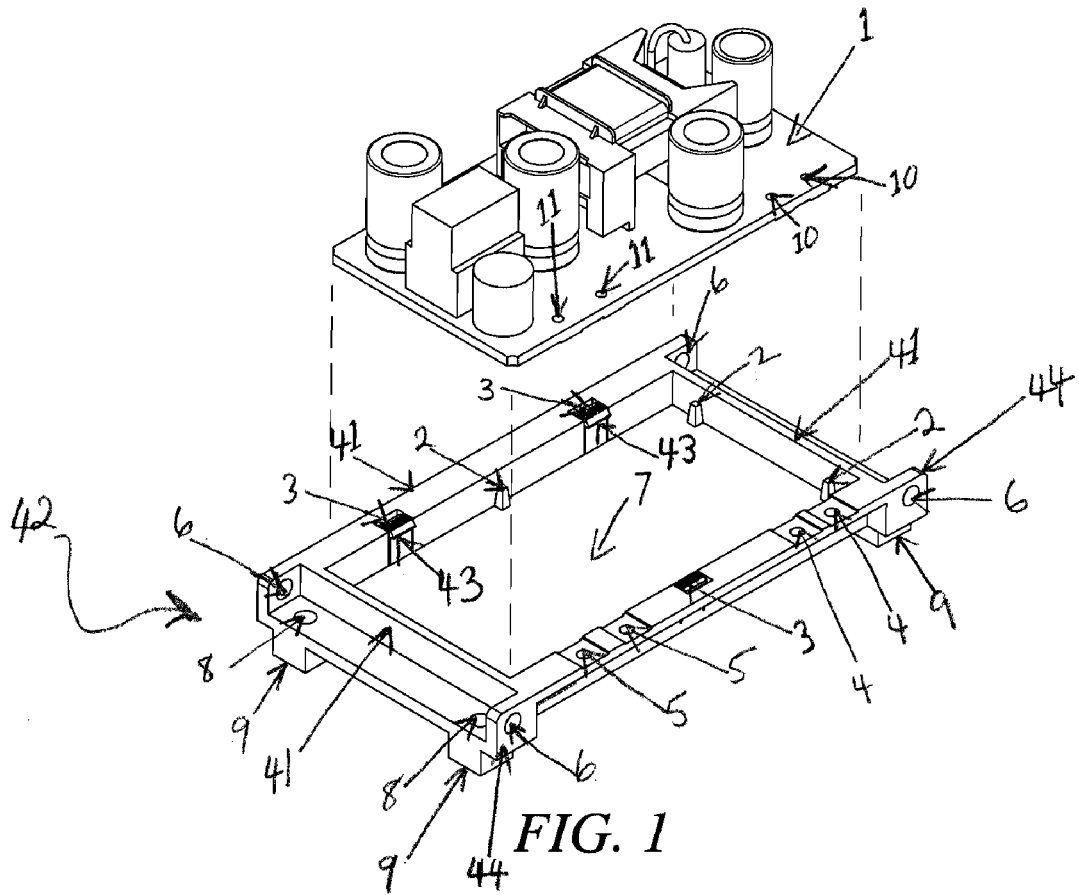
FIG. 1 is perspective view of a SMPS and a plastic frame Mounting Frame, showing the mounting technique.

Integrally molded within the opening of the frame 42 is a plurality of mounting studs 2. The mounting studs 2 are illustrated as conically shaped extensions of each of the four walls 41 of the frame. To this end, the bottom portion of the mounting studs 2 may be wider than the top portions such that the mounting studs 2 are inwardly tapered from the bottom to the top. In one embodiment, the top portions of the mounting studs 2 are flat wherein the top portion of each mounting stud 2 is coplanar, so as to support the PCB 1. The mounting studs 2 may be positioned at any point along the walls 41 of the frame 42 forming the opening. As illustrated in FIG. 1, these positions may include the junction between two walls or the approximate center point of the walls.

Figure 2:
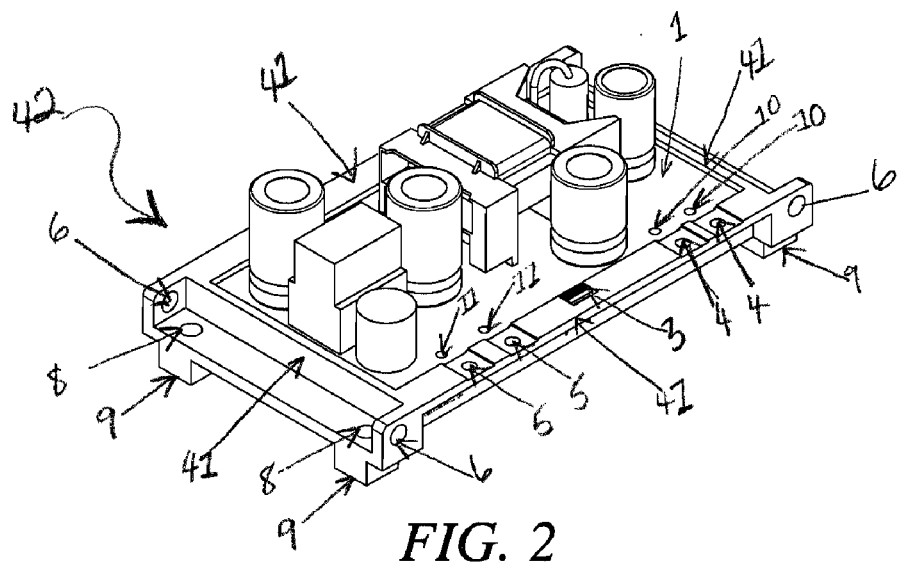
FIG. 2 is a perspective view, showing PCB assembled into the Mounting Frame.
Figure 8:
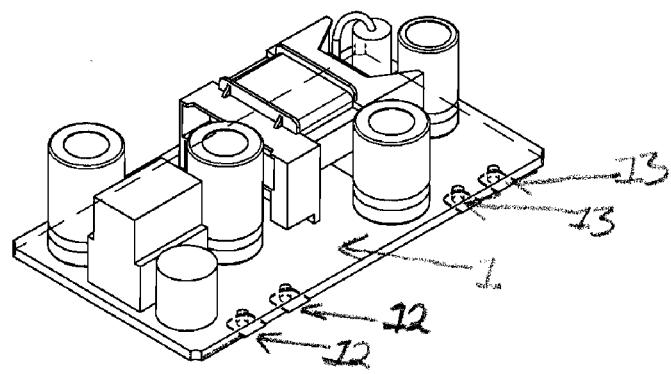
FIG. 8 is a perspective view of a SMPS with edge card connections, showing the input and output connections to the PCB.
Figure 9:
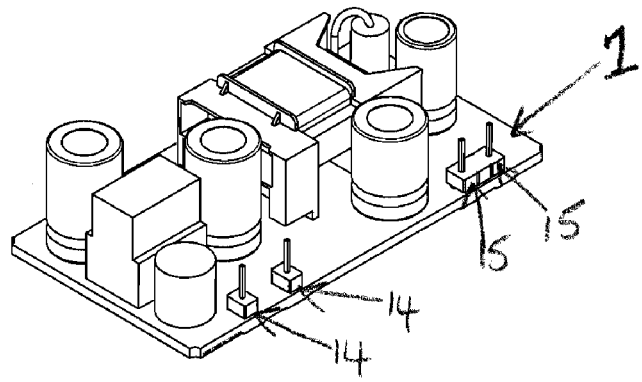
FIG. 9 is a perspective view of a SMPS with electrical connectors, showing the electrical connectors soldered directly to the PCB.

In the above configurations, the mounting studs provide support for holding a PCB 1 within the mounting frame 42. Referring to FIGS. 1 and 2, the mounting studs 2 provide support for the PCB in the frame such that the PCB 1 is held within the opening of the frame 42 and proximate to an upper surface of the frame. The foregoing structure of the mounting studs 2, however, in not intended to be limiting to the present invention. Rather, the mounting studs 2 may be of any similar configuration understood by one of ordinary skill in the art to provide structural support for the PCB 1 within the opening of the frame 42.

The PCB 1 may be further secured within the opening of the frame 42 by a plurality of retention clips 3. The retention clips 3 may be comprised of a metallic material and may be a configured as a spring or with a spring-type of mechanism. The retention clips 3 are, preferably, sized to be received by a plurality of recesses on the interior walls of the mounting frame 42 wherein the clips are received therein so as to be flush with the sides and top of the walls 41. Each retention clip 3 may be comprised of a retention ridge or lip that extends perpendicularly from the interior side of the side walls 41 toward the center of the frame 42. These ridges, ultimately, provide a securing force for the PCB 1. However, the present invention is not intended to be limiting to the retention clips illustrated and discussed herein and the PCB may be secured within the frame 42 by any similar or other methods known in the art.

In the most preferred embodiment, the retention clips 3 and mounting studs 2 cooperate to rigidly hold the PCB therewithin. More specifically, as illustrated in FIG. 1, the mounting studs 2 extend upwardly approximately one-half to three-quarters of the way up the walls 41 of the frame 42. The ridges 43 of the retention clip extend perpendicularly from the walls 41 at approximately the top of the wall. The distance between the top portions of the mounting stud 2 and the ridges 43 of the retention clip is approximately the same as the width of a PCB 1. Thus, when the PCB board is inserted into the opening of the frame 42, the mounting studs 2 provide an upward force on the PCB 1 and the retention clips 3, by way of the ridges 43, provide a counterbalancing downward force on the PCB 1, thereby, rigidly securing the PCB within the opening of the mounting frame 42. Because the retentions clips 3 are in a metallic spring-like configuration, the PCB 1 may easily be removed from the frame 42 by actuating the ridges away from the PCB 1 and within the recesses of the walls 41. This actuation, in turn, releases the counterbalancing force supplied by the clips and allows one to remove the PCB 1 with relative ease.

In one embodiment, an optional bottom wall 7 may extend between the four walls of the frame. The bottom wall, when present, is preferably solid and provides greater electrical isolation for the PCB 1. The bottom wall 7 may be integrally molded with the four walls 41 of the frame such that it extends between the walls and underneath the mounting studs 2. To this end, when the PCB 1 is coupled to the frame 42 in accordance with the above, there is a slight gap between the PCB and the bottom 7 wherein the size of the gap is determined by the length of the mounting studs 2. In further embodiments, the bottom 7 of the mounting frame 42 can be coated with an electrically conductive material if, for example, a ground plane is needed beneath the SMPS. For example, such an electrically conductive material may be comprised of a metallic foil coupled to the bottom 7 of the frame. The present invention is not limited to a bottom 7 in accordance with the above. Rather, the bottom 7 of the frame 42 may be open so as to allow for improved air circulation in the PCB 1.

Figure 11:
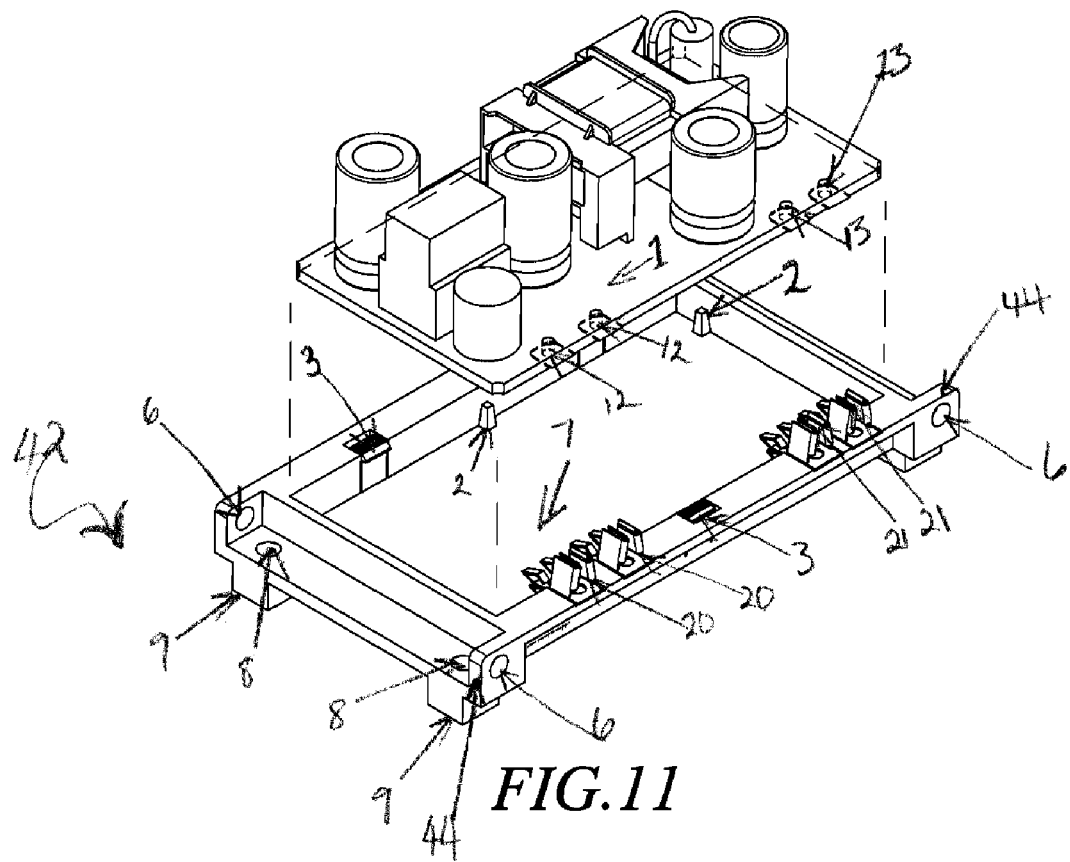
FIG. 11 is perspective view of a PCB with edge card, showing the connections and a corresponding Mounting Frame.
Figure 12:
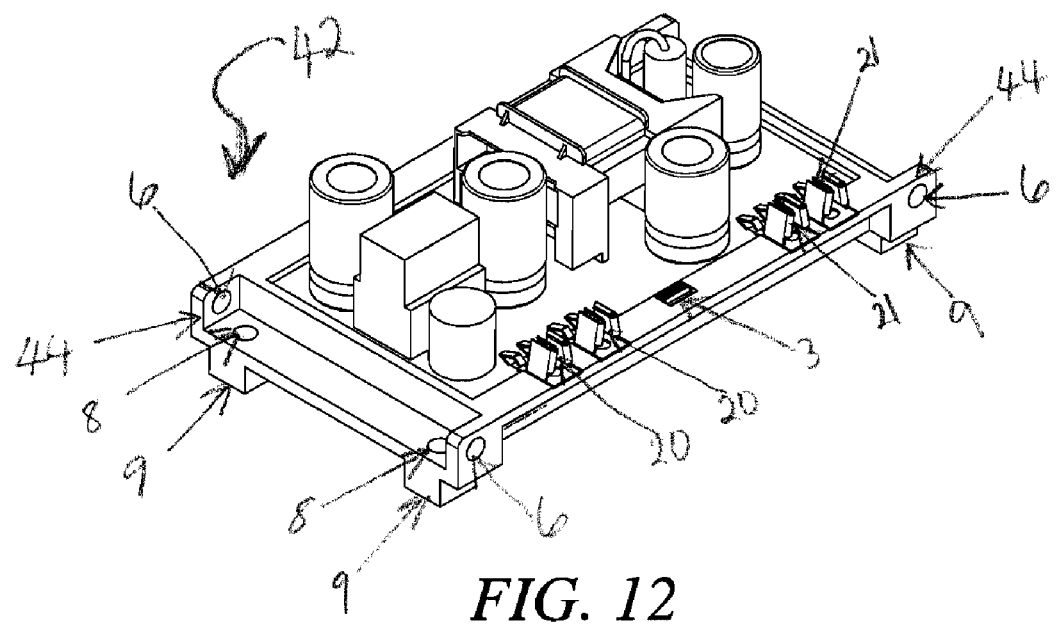
FIG. 12 is a perspective view of a PCB with edge card, showing the connections assembled into a Mounting Frame.
Figure 13:
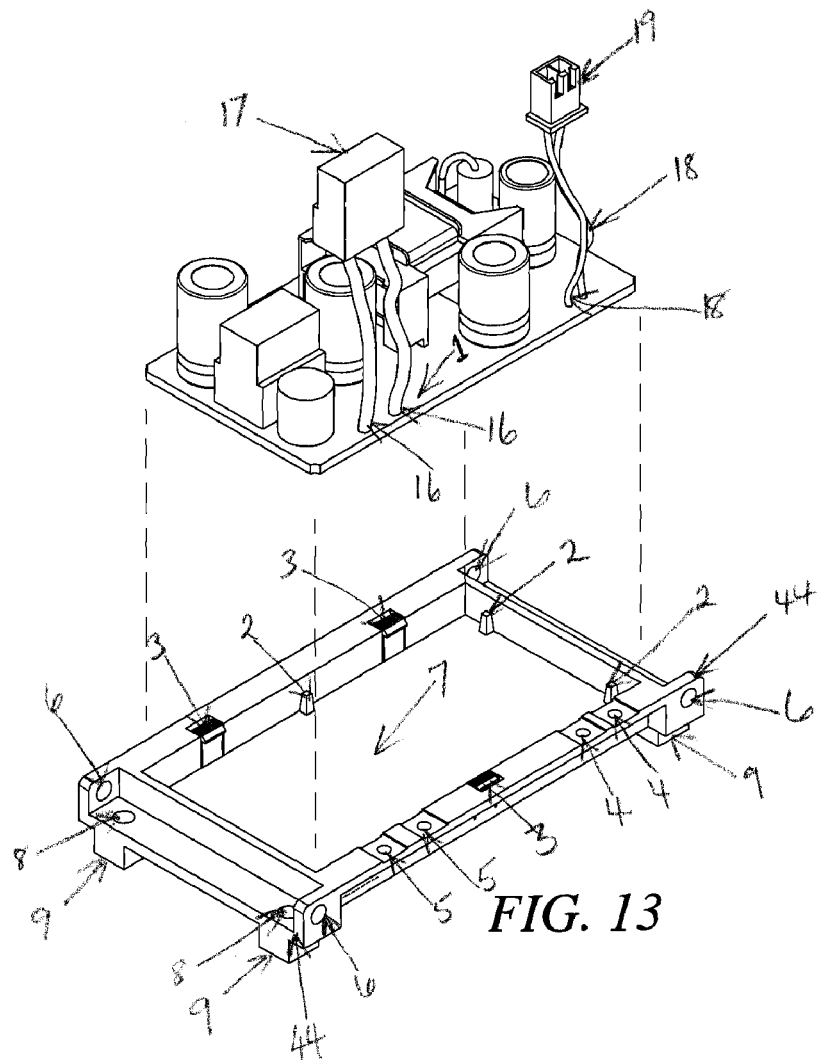
FIG. 13 is perspective view of a PCB with electrical connections via wires and the corresponding Mounting Frame.
Figure 14:
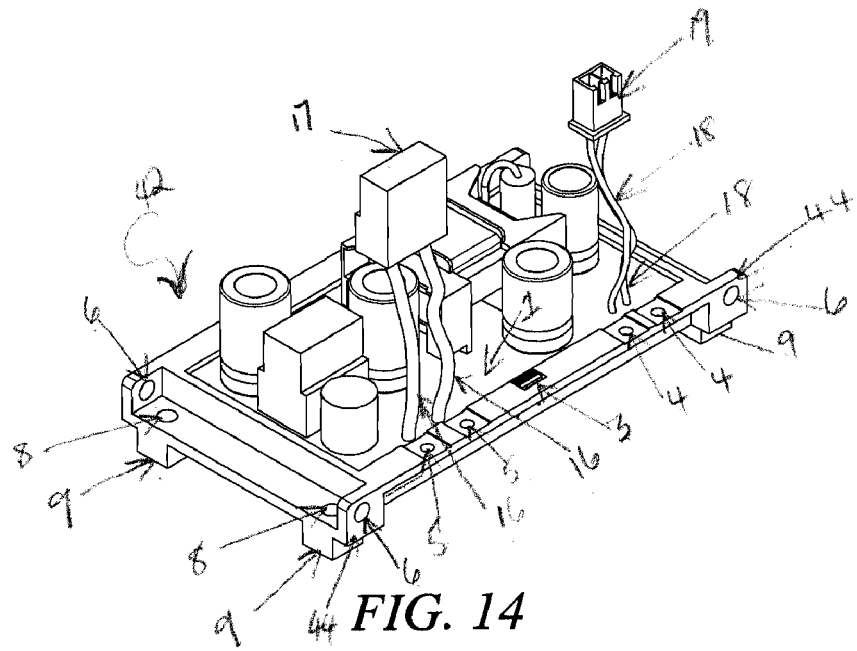
FIG. 14 is a perspective view of a PCB with electrical connections via wires assembled into a Mounting Frame.

The mounting frame 42 may, optionally, provide for at least one location for each of a plurality of electrical connections to the switch mode power supply. As illustrated in FIG. 1, a plurality of recesses, preferably four recesses, may extend along a top of at least one of the four walls 41 of the frame 42. Each of these recesses may be adapted to receive or retain the required electrical connections for the switch mode power supply. For example, in one embodiment, two recesses 5 are on the frame adjacent to a position on the PCB 1 adapted to receive one or more AC input contacts 11. The recesses 5, in one embodiment, provide structural support for the AC input wiring and/or contacts of the switch mode power supply extending from the AC input positions 11 of the PCB 1. Two additional recesses 4 may be positioned in the frame adjacent to one or more positions of the PCB 1 adapted to receive one or more DC output contacts 10. These recesses 4 may also be adapted to provide structural support for the DC output wiring and/or contacts of the switch mode power supply extending from the DC output positions 10. In one embodiment, as illustrated in FIGS. 11 and 12, clips 20, 21 may be mounted within the recesses 4, 5 on the edge of the mounting frame 42. These clips are preferably comprised of a metallic composition, although not limited thereto, and are adapted to receive one or more slidable contact pads 12, 13. These slidable contact pads 12, 13 engage the metallic clips 20, 21 so as to secure the pads 12, 13 to the frame. To this end, the accompanying AC input wiring and DC output wiring in electrical communication with the contact pads 12, 13 are also secured to the frame 42.

The present invention is not limited to securing the AC input and DC output to the frame as discussed above. Rather, as illustrated in FIGS. 9, 10, 13 and 14, the requisite electrical contacts or wiring may extend directly from the PCB 1 at the appropriate locations 10 and 11. For example, referring to FIG. 9, a plurality of pin header type electrical connectors 14 and 15 may be soldered directly to the PCB 1 wherein electrical connector 14 may be electrically coupled or connected to a corresponding AC input cable or wire and electrical connector 15 may be electrically coupled or connected to a corresponding DC output cable or wire.

Figure 10:
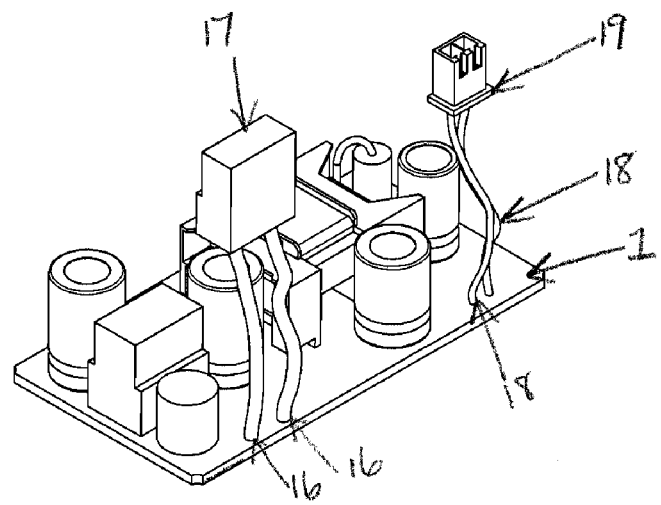
FIG. 10 is a perspective view of a SMPS with electrical connectors, showing the electrical connectors attached to the PCB via wires.

In an even further alternative embodiment, referring to FIG. 10, electrical wiring may extend directly from the PCB 1. For example, in one embodiment, one end of a plurality electrical wires 16 may be directly soldered at the AC input position 11 of the PCB. The opposing end of the wires 16 may be in electrical communication with an electrical connector 17 used to place the PCB 1 into electrical communication with the AC power source. Similarly, one end of a plurality of second electrical wires 18 may be directly soldered at the DC output position 10 of the PCB 1. The opposing ends of the wires 19 may be in electrical communication with a second electrical contact or connector 19 used to place the PCB 1 into electrical communication with the DC powered device.

The present invention is not limited to the foregoing embodiments of the electrical contacts. Rather, the present invention may be comprised of any other type of electrical contacts known in the art for a switch mode power supply.

Referring to FIG. 1, each end of the frame is comprised of a coupling extension 44. The coupling extension 44 is integrally molded within the frame and, preferably, extends from two opposing ends of the frame. The extension 44 is elongated and rectangularly shaped with a length approximately the same as the adjoining side wall and a cut-out or recess extending along the longitudinal axis of the extension 44. Positioned beneath each corner of the extension assembly 44 is a plurality of standoffs 9. The standoffs 9 are cubically shaped, although not limited thereto, and are integrally molded with both the extension assembly 44 and the frame 42. As discussed further below, the extension assembly 44 facilitates the coupling of the frame to various configurations of the switch mode power supply.

In one embodiment, each corner of the frame 42 is comprised of a plurality of through-holes adapted to facilitate coupling the frame to a switch mode power supply packaging configuration. The first through holes may be horizontally positioned through holes 6. More specifically, as illustrated in FIG. 1, the through holes may be horizontally oriented and pass through opposing ends of the coupling extension 44 such that the hole 6 passes from a flat, exterior side of the coupling extension through the wall to the cutout portion of the extension 44. In one embodiment, as illustrated, there may be a wall at either end of the cut away portion of the frame such that there is one horizontal hole 6 at either end. Alternatively, the cutaway may have an open end and one wall at the opposing end such that there is only one horizontal hole in the extension assembly 44 wherein the horizontal hole 6 is only at the one end of the frame.

Figure 15:
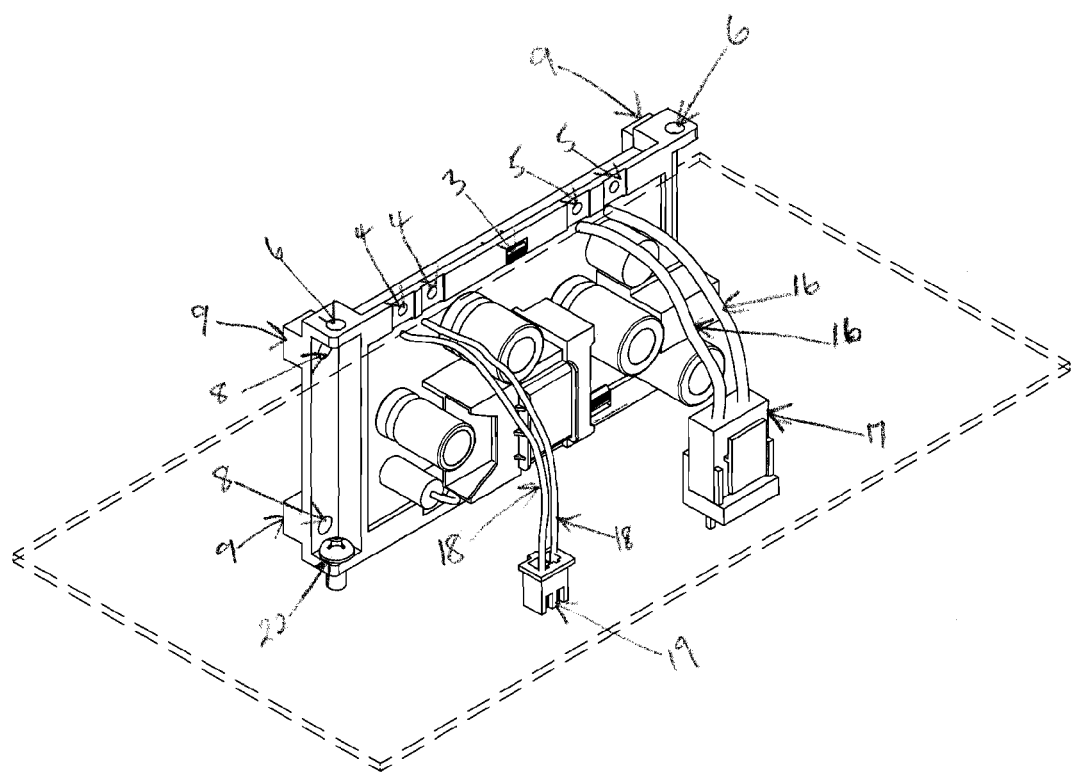
FIG. 15 is a perspective view of PCB with electrical connections via wires, showing the assembled mounting frame mounted in an enclosure.

As illustrated in FIG. 15, in one embodiment, the horizontal through holes 6 allow the frame 42 to be mounted on its side. Specifically, the through holes 6 may be adapted to allow a coupling mechanism to extend through the hole 6 and couple the frame 42 to a known switch mode power supply casing or configuration. For example, in one embodiment, the hole 6 may be internally threaded such that a screw, or similar coupling element, may threadingly engage both the hole 6 and a corresponding hole positioned on the switch mode power supply casing. This embodiment, however, is only intended for illustration and, as shown further below, is not limiting to the present invention.

Referring again to FIG. 1, a plurality of second through holes 8 are illustrated. These second through holes 8 are vertically positioned through the cutout portion of the extension assembly 44. More specifically, the second set of through holes 8 pass from a flat, interior side of the cut away portion of the coupling extension 44 through the wall to an underside of the extension 44. In a most preferred embodiment second through holes 8 extend through the plurality standoffs 9 positioned proximate to each corner of the frame.

Much like the horizontal through holes 6, the vertical through holes 8 may provide a mechanism to mount the frame 42 to a switch mode power supply casing. Specifically, the through holes 8 may be adapted to allow a coupling mechanism to extend through the holes 8 to the power supply packaging or configuration such that the frame 42 is horizontally oriented. For example, in one embodiment, the holes 8 may be internally threaded such that a screw, or similar coupling element, may threadingly engage the holes 8 and a corresponding hole positioned on the switch mode power supply casing. Additionally, in this configuration, the standoffs 9 prevent the bottom 7 of the frame 42 or the side walls 41 of the frame from contacting any aspect of the switch mode power supply casing.

In an even further embodiment, each of the horizontally oriented through holes 6 are adapted to receive one or more studs 26. Although not limited to one particular shape, the studs 26 are preferably comprised of a cylindrical rod with a length slightly longer than that of the frame. More specifically, referring to FIG. 18, in one embodiment, the studs 26 are comprised of a central, hollowed, cylindrical element with two extensions adapted to be received within the cylindrical element, such as by a threading engagement. The cylindrical element is sized to fit within the cutaway portion of the extension 44 such that each end the of cylindrical element is juxtaposed to a horizontal hole 6. The two extensions of the stud 26 may extend through both holes 6 at each end of the frame and engage the cylinder such that the studs 26 are secured to the frame 42.

In one embodiment, each extension of the studs 26 may contain one or more annular enlargements 45. The annular enlargements 45 may be of any diameter greater than the diameter of the extensions and/or cylinder of the studs 45 and function as a retention mechanism in accordance with the description below.

Figure 16:
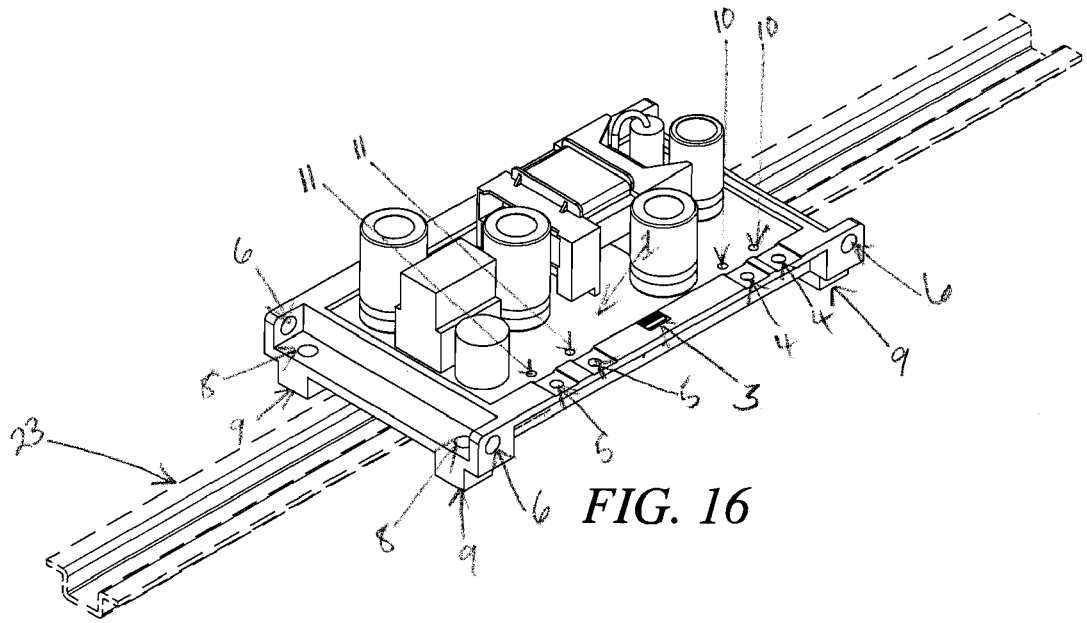
FIG. 16 is a perspective view of a PSU and Mounting Frame mounted on a rail, illustrating the PSU and Mounting Frame mounted along its length.
Figure 17:
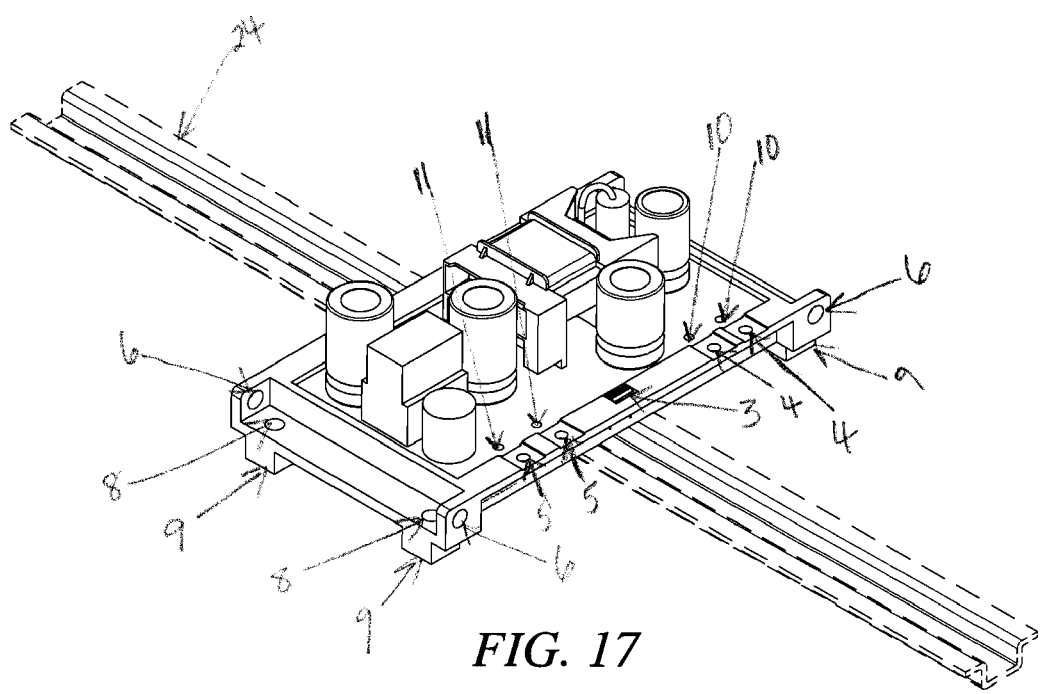
FIG. 17 is a perspective view of a PSU and Mounting Frame mounted on a rail, illustrating the PSU and Mounting Frame mounted along its width.

Referring to FIGS. 16 and 17, in another embodiment the frame 42 is adapted to be mounted to a U-channel or DIM rail. Specifically, the bottom 7 and/or underside of the side walls 41 of the frame 42 may further include an optional bracket or groove wherein the bracket or groove is shaped to receive the U-channel or DIM rail. Alternatively, the frame 42 may be equipped with any similar mechanism of coupling a frame to a U-channel or DIM rail that is known in the art, so long that the frame is within the specifications discussed herein.

The foregoing frame 42 of the present invention may be manufactured using any molding process known in the art. In a preferred embodiment, the frame 42 is manufactured utilizing an injection molding process. In a most preferred embodiment, the frame 42 in each of the embodiment discussed herein may be manufactured by molding the frame directly to the PCB 1. To this end, the PCB 1 may be placed directly into the mold tool and the frame 42 molding directly thereto such that the completely conforms to the frame 42, while still allowing for removability of the PCB 1 in accordance with the above. In a most preferred embodiment the frame of the present invention is molded using a Mold-man 8100 manufactured by Cavist, Corp. of Reno, Nev. However, the present invention is not limited the this molding method and may utilize any similar molding method known in the art.

In accordance with the foregoing embodiments of the structure of the frame 42, the PCB 1 may be coupled within the frame 42, in accordance with the description above, wherein the frame is receivable by a switch mode power supply packaging configuration. In a first embodiment, referring to FIG. 15, the frame 42 may be vertically mounted to a chassis, rack, or similar configuration in a switch mode power supply. More specifically, and in accordance with the foregoing structure provided, the frame 42 is mounted such that one side of the a side wall 41 contacts the chassis or rack wherein the horizontal through holes 6 at each end of that side aligns with similarly spaced through holes, or one continuous groove, of the rack or chassis. A coupling mechanism 22, illustrated as a screw in FIG. 15, may threadingly engage both the horizontal through holes 6 and the similarly spaced holes of the rack or chassis so as to couple one side of the frame 42 thereto. The frame 42 is also mounted to the chassis or rack such that the AC and DC electrical contacts extending from positions 11, 10 may be placed into electrical communication with the corresponding contacts of the switch mode power supply. For example, as illustrated in FIG. 15, electrical wiring may extend directly from the PCB 1 wherein the electrical connector of the AC power source 17 and the electrical connector of the DC output 19 are placed into electrical communication with the corresponding contacts of the switch mode power supply. The present invention is not limited to the method of electrical connection illustrated in FIG. 15 and may be comprised of any further method discussed herein.

In addition to the foregoing, the side of the frame 42 that is mounted to the chassis or rack is opposite of the side of the frame containing the recesses 4, 5 and opposite the side of the PCB 1 containing the AC and DC contacts at positions 11, 10. To this end, both the recesses 4, 5 of the frame 42 and the AC and DC electrical contacts secured at positions 11 10 that are easily accessible and manipulated without removing the frame 42 from the chassis or rack. To this end, the PCB 1 or aspects of the PCB may be replaced or repair without having to remove the frame from the rack or chassis.

In an alternative embodiment of FIG. 15, the frame 42 may be secured to the rack or chassis in a horizontal configuration. More specifically, the frame 42 is mounted such that each of the four standoffs 9 contact the chassis or rack. The vertical through holes 8 extending through each standoff 9 and, preferably, at each end of the frame 42 aligns with similarly spaced through holes, or several continuous grooves, of the rack or chassis. A similar coupling mechanism as that illustrated in FIG. 15, may threadingly engage both the vertical through holes 8 and the similarly spaced holes of the rack or chassis such that the coupling mechanism secures the frame 42 to the rack or chassis.

Referring to FIGS. 16 and 17, an alternative embodiment of the present invention is illustrated wherein the mounting frame 42 is coupled to a U-channel. The frame can be mounted to rail 23 either with a bracket or by including a matching slot in the bottom of the mounting frame wherein the bracket or slot is shaped to receive the U-channel. Alternatively, the frame 42 may be equipped with any similar mechanism of coupling a frame to a U-channel that is known in the art, so long that the frame is within the specifications discussed herein.

Figure 18:
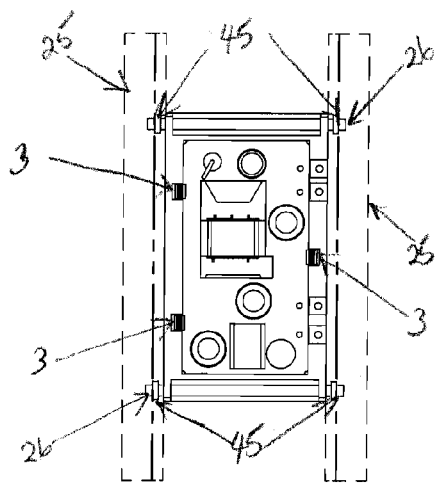
FIG. 18 is a top elevation view of a PCB and Mounting Frame, showing the alignment of guide tracks for mounting in a chassis with multiple PSUs.
Figure 21:
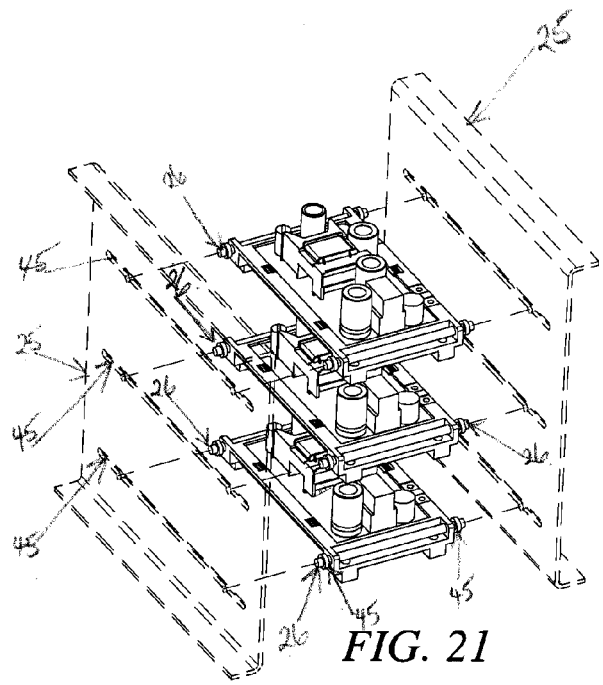
FIG. 21 is perspective view of multiple PSUs and a chassis, illustrating the connections of PSU and Mounting Frame in layers
Figure 19:
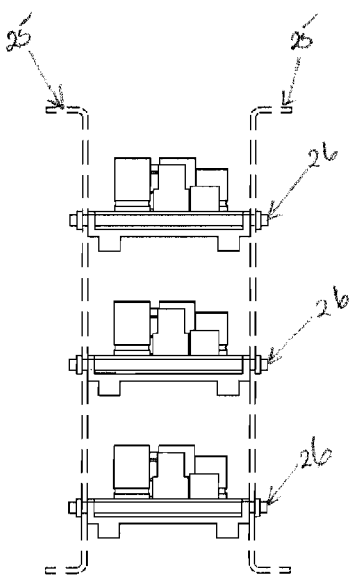
FIG. 19 is a front elevation view of multiple PSUs in a chassis, showing the layers of PSUs and Mounting Frame.
Figure 20:
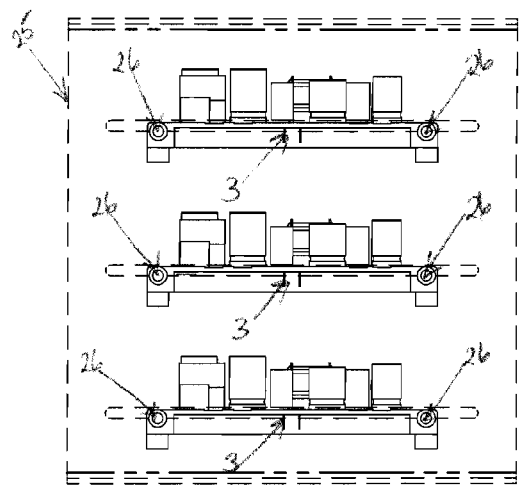
FIG. 20 is a side elevation view of multiple PSUs in a chassis, showing the PSUs and Mounting Frame stock in layers either transversely or laterally.

In an even further embodiment, the frame 42 of the present invention may be mounted to a rack mounting system using the studs 26. Referring to FIGS. 18 through 20, a plurality of chassis panels 25 are illustrated as forming a standard rack mounted system for multiple switch mode power supply units. In the embodiments illustrated, the mounting extension 44 is equipped with at least one stud 26 at each end wherein the studs 26 are secured to the frame 42 by way of the horizontal through holes 6 and in accordance with the foregoing description. Each stud 26 contains and annular enlargement 45 that is set slightly away from the frame 42. As illustrated in FIGS. 18-21, each end of the plurality of studs 26 may be received within a elongated groove 46 of the chassis panels 25. Specifically, the studs 26 may be received by the grooves 46 such that the enlargement portion 45 extends through the groove and the walls of the grooves 45 of the chassis panels 25 rest against the stud 26 in the space between the enlargement portion 45 and the frame 42. To this end, frame 42 is secured within the chassis panel 25 and the enlargement portions 45 at either end of each stud 26 prevents inadvertent disengagement of the frame and PCB from the chassis panel. The PCB 1 secured within this position may then be placed into electrical communication with the switch mode power supply by any means discussed herein or understood in the art.

In a further embodiment of the above, and as illustrated in FIGS. 18-21, multiple frames/PCBs may be mounted within a single chassis panel 25. High reliability applications often require redundant power supplies in case a primary power supply fails. Additionally, switch mode power supply units with multiple AC inputs and DC outputs have the disadvantages of being larger, more complicated, and requiring more air flow for heat removal than single output power supplies. The foregoing mounting frame approach, however, offers designers the option of using several single output PCBs in place of a multiple output device. The mounting frames can provide a standard foot print so the system designer can mix single output, multiple output, and redundant power supplies. If a mounting stud 26 is added to the frame in accordance with the above, a multiple PCB chassis panel will allow multiple frames to slide into a corresponding groove in the chassis panels 25 in accordance with the foregoing. This multiple frame application is not limited to the used of the stud 26 mounted frame and may also include either vertically mounted or horizontally mounted frames secured to the panel by a coupling mechanism contemplated herein.

In another embodiment, referring to FIGS. 22-25, a chassis mounting embodiment of the present invention is illustrated. More specifically, in the chassis mounting embodiment, the chassis may be comprised of a single walled chassis 27 with one or more grooves 47 wherein the single walled chassis 27 is supported in a switch mode power supply by one or more legs or another similar mechanism known in the art. The frame 42 of the present invention, in one embodiment, is equipped with the mounting studs 26 extending from the coupling extension 44 in accordance with the above. In this embodiment of the chassis, rather than support the mounting frame on opposite sides as with FIGS. 18-20, the chassis 27 supports the frame on one side by way of the mounting stud 26. For example, as illustrated in FIGS. 22-25, one end of the stud 26 is received within the groove 47 of the chassis 27. Specifically, the stud 26 is received by the groove 47 such that the enlargement portion 45 extends through the groove and the grooves 47 of the chassis panels 27 rest against the stud 26 in the space between the enlargement portion 45 and the frame 42. To this end, frame 42 is secured within the groove 47 of the chassis 27 and the enlargement portion 45 prevents inadvertent disengagement of the frame and PCB from the chassis 27. As illustrated in FIG. 22-25, the frame 42 and PCB 1 may be secured in a vertical orientation, however, the present invention is not limited to this configuration. Regardless, of which configuration is chosen, once installed into the chassis 27 the PCB 1 may then be placed into electrical communication with the switch mode power supply by any means discussed herein or understood in the art.

In a further embodiment of the above, and as illustrated in FIGS. 22-25, multiple frames/PCBs may be mounted within a single chassis 27. As previously discussed, such a configuration offers numerous advantages to designers including the option of using several single output PCBs in place of a multiple output device; mixing single output, multiple output, and redundant power supplies; and allowing multiple frames to slide into a corresponding groove in the chassis 27 in accordance with the foregoing.

The foregoing embodiment of the frame coupled to the chassis 27 is not limited to the use of the stud 26, in either a single unit or multiple unit configuration. Rather, both the single frame and multiple frame application of the chassis 27 may also include either vertically mounted or horizontally mounted frames secured to the panel by any coupling mechanism contemplated herein or known in the art.

Referring to FIGS. 30-33, an alternative embodiment is illustrated wherein the frame 42 is receivable within a support frame or casing 38, 39 of a switch mode power supply. More specifically, FIGS. 30 through 33 illustrate an enclosure design that is built around the size of the mounting frame 42. In this embodiment, the mounting frame 42 and the PCB 1 are coupled together in accordance with the above. A bottom section 38 of a support frame is comprised of a bottom 48 and four side walls 49 forming a, preferably, rectangular encasing.

Extending within the bottom section 38 is two or more ledges 37. The ledges 37 preferably extend along the junction of the walls 49 and bottom 48 leaving a gap between the ledge 37 and the sidewall that is perpendicular to the ledge 37. This gap is sized to receive the standoff 9 of the frame 42 such that, when the frame is installed within the casing, the ledges 37 prevent the frame 42 and PCB 1 from sliding therein. As illustrated in FIGS. 30 and 32, in one embodiment the space between the ledge 37 and the side wall perpendicular to the ledge 37 may contain a through hole (not illustrated). The through hole is sized to receive the standoffs 9 of the frame 42. In this configuration, standoffs 9 of the frame 42 fit through the through holes of the bottom 38 and provide a plurality of feet or legs to the casing.

A lid 39 is also provided to complete the assembly of the casing in FIGS. 30-33. More specifically, the lid 39 is comprised of a top 50 and four walls 51 and is sized to be coupled to or interconnected with the bottom portion 38 of the casing. In one embodiment, the side walls of the lid 39 may be glued or bonded to the side walls of the bottom 38 of the casing. However, the present invention is not limited to this configuration and the bottom of the casing may be secured to the top of the casing by any other configuration known in the art. Regardless of the method of coupling used, the top and bottom must be secured such that both the frame 42 and PCB (including all necessary components) can fit within the enclosure of the casing and are not hindered from operation.

In a further embodiment, each of the bottom portion 38 and top portion 39 are adapted to interconnect so as to allow for receipt of an AC input and DC output cable. For example, as illustrated in FIG. 33, each of the bottom half 38 and the top half 39 of the casing contain a plurality of cut away portions 52a, 52b adapted to receive the AC input and DC output cables or wiring of the switch mode power supply. A first cutaway portion 52a may be, but is not limited to, a circularly shaped through hole and a second cutaway portion 52b may be a rectangularly shaped through hole, although neither through hole is limited to this configuration.

Each through hole 52a, 52b may be molded within the encasing such that the AC input contacts and recesses of the PCB and frame may be accessed by an AC input cable through one hole and the DC output contacts and recesses of the PCB and frame may be accessed by a DC output cable. For example, as illustrated in FIG. 33, the circular through hole 52a is positioned on the casing such that it is proximate to the DC recesses 4 of the frame and the contacts at position 10 of the PCB 1. Similarly, the rectangularly shaped through hole 52b is positioned on the casing such that it is proximate to the AC recesses 5 an the contacts at position 11 of the PCB 1. In this configuration, a DC outlet cable 40 may be received by the casing and placed into electrical communication with the contacts extending from position 10, which may be any of the foregoing contacts discussed herein or any other contacts known in the art for application to the switch mode power supply. An AC inlet mechanism may be coupled to the through hole 52b and placed into electrical communication with contacts extending from position 11. The AC inlet mechanism may be permanently affixed as a cable/wiring, or may be a receptacle 33, such as the embodiment illustrated in FIG. 33, wherein the receptacle 33 is electrical communication with the PCB 1. In the later embodiment, the receptacle 33 permanently affixed within the through hole 52b and adapted to receive a cable of an AC power inlet or the like.

The foregoing embodiment of the casing is not intended to be limiting in structure. Rather, the casing may be adapted to any known use of a similar casing in a switch mode power supply wherein the casing receives the frame and PCB of the present invention. Such casing may include, but are not limited to, a table top/desk top configuration, a wall mount configuration, a module configuration or any other configuration known in the art to require a similar casing. To this end, the configuration of the casing above and the methods of and structure of the AC input and DC output are not limited to the cable and receptacle disclosed above. These aspects may include any embodiment of an AC input and DC output know in the art with respect to each known switch mode power supply configuration wherein the AC input and DC output are placed into electrical communication with the respective locations on the PCB and frame. In other words, the design of the casing, placement of the AC inlet, type of AC inlet, placement of the DC inlet, type of DC inlet, etc. may all be modified based upon the intended use of the configuration and designs of these elements that are known in the art.

Figure 27:
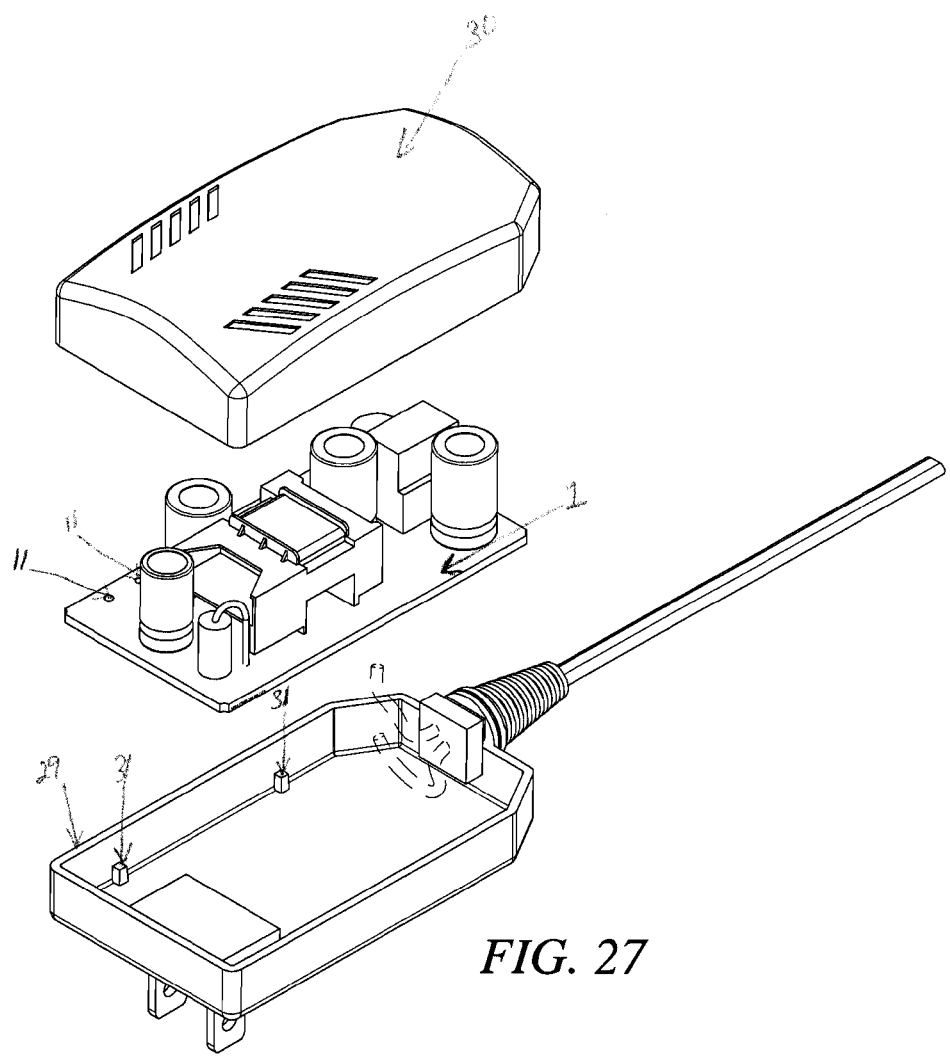
FIG. 27 is a perspective view of the inside of a wall mounted power supply, showing the inside of the plastic enclosure and the mechanical support designed for use in mounting PCBs into the frames.
Figure 26:
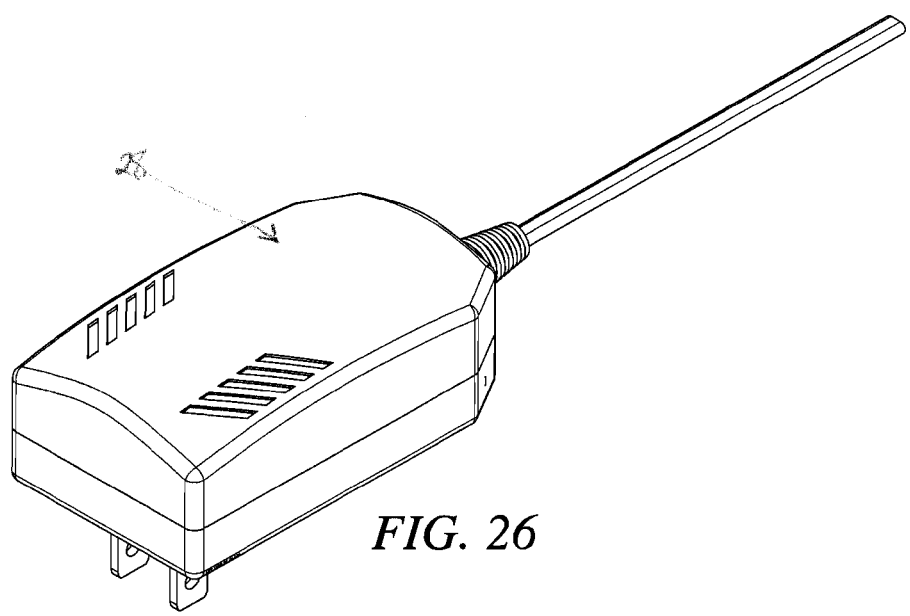
FIG. 26 is a perspective view of a wall mounted power supply packaged in a plastic enclosure.

In an even further alternative embodiment of the present invention, the frame 42 of the present invention may be modified so as to comprise the bottom half 29 of a casing 28. Referring to FIGS. 26 and 27, the frame is illustrated as the bottom half 29 of a wall mounting enclosure. The bottom half 29 is comprised of four walls and a bottom, just as one embodiment of the frame, and a plurality of mounting studs 31 secured therein. The bottom half 29 of the enclosure is sized to receive a PCB 1 in accordance with the criteria above. The bottom half 29 is also sized to receive a lid or top half 30 wherein the lid 30 is comprised of a top and four walls and is adapted to structurally support the PCB 1 within the casing 28. To this end, the lid 30, in one embodiment, replaces the need for the clips of the frame.

The lid 30 is adapted to be coupled to or interconnected with the frame/bottom portion 29 of the casing 28. In one embodiment, the side walls of the lid 30 may be glued or bonded to the side walls of the frame/bottom 29 of the casing. However, the present invention is not limited to this configuration and the bottom of the casing may be secured to the top of the casing by any other configuration known in the art. Regardless of the method of coupling used, the top and bottom must be secured such that the PCB (including all necessary components) can fit within the enclosure of the casing and are not hindered from operation.

In the embodiment illustrated in FIG. 27, the bottom is configured to receive alternating current through a AC outlet prong 53. Specifically, the AC inlet prong may be integral with the bottom of the of the bottom half 29 such that a first side is exposed as a contact on the interior surface of the bottom half 29 of the casing and a second side is comprised of prongs directly received by an AC outlet at the prong end. When the PCB 1 is received within the bottom half 29, the AC contacts of position 11 aligned with the first side of the AC inlet such that the contacts of position 11 may be placed into electrical communication with the AC inlet, such as an edge card type of connection. Alternatively, the AC inlet may be placed into communication with contacts at position 11 by any method of electrical connectivity discussed herein or known in the art.

The PCB 1 is further in electrical communication with a DC power outlet. Specifically, similar to embodiments disclosed above, the DC outlet cable may be received and/or permanently affixed to a wall of the frame/bottom half 29 by way of one or more through holes therethrough. As illustrated by the broken lines in FIG. 27, the DC outlet cable is placed into electrical communication with the contacts of the PCB 1 at position 10 such that the PCB 1 is placed into electrical communication with the DC outlet. The method of placing the DC outlet may be by directly soldering the wires of the DC outlet to contacts at position 10 of the PCB 1. Alternatively, the DC outlet may be placed into communication with the contact at positions 10 by any method of electrical connectivity discussed herein or known in the art.

Figure 29:
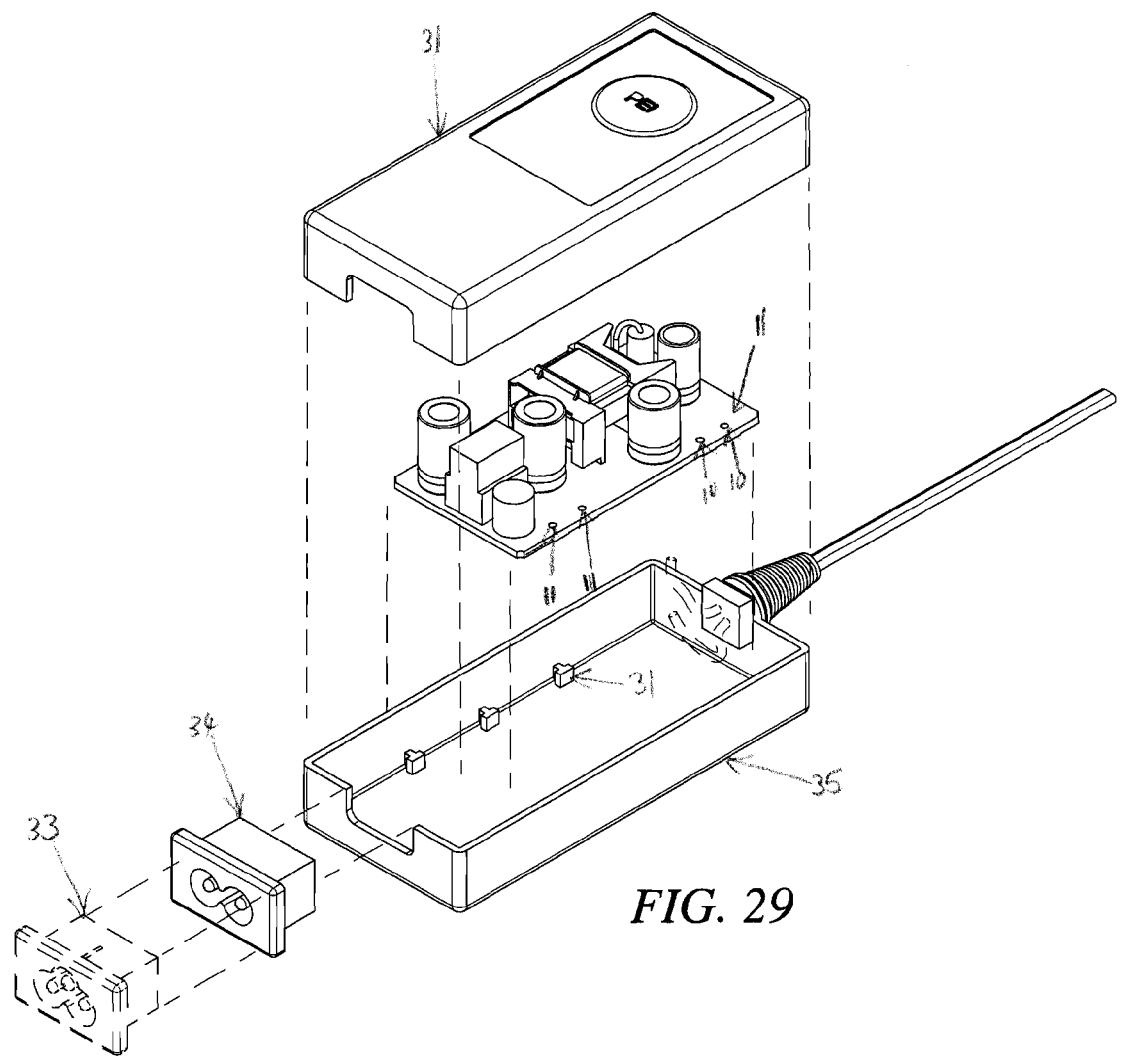
FIG. 29 is a perspective view of the inside of a desk top power supply, showing the mechanical support designed for use in mounting PCBs into the frames.
Figure 28:
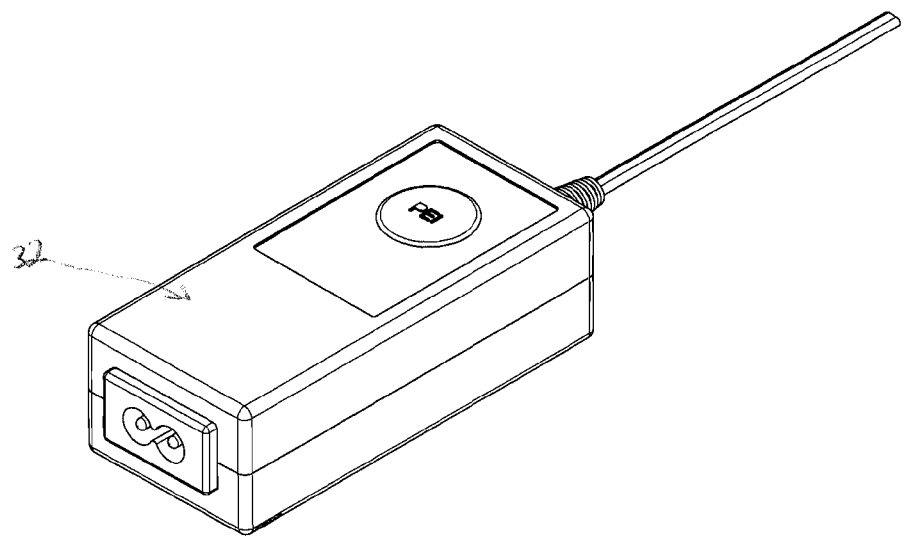
FIG. 28 is a perspective view of a desk top power supply packaged in a plastic enclosure.

In an even further alternative embodiment of the present invention, the frame may also be adapted to form the bottom half of a typical table top power supply. Referring to FIGS. 28 and 29, the frame is illustrated as the bottom half 35 of a casing 32 for a table top power supply, such as that used for a laptop or similar device. The bottom half 35 is comprised of four walls and a bottom, just as one embodiment of the frame, and a plurality of mounting studs 31 secured therein. The bottom half 35 of the enclosure is sized to receive a PCB 1 in accordance with the criteria above. The bottom half 35 is also sized to receive a lid or top half 36 wherein the lid 36 is comprised of a top and four walls and is adapted to structurally support the PCB 1 within the casing 32. To this end, the lid 36, in one embodiment, replaces the need for the clips of the frame.

The lid 36 is adapted to be coupled to or interconnected with the frame/bottom portion 35 of the casing 32. In one embodiment, the side walls of the lid 36 may be glued or bonded to the side walls of the frame/bottom 35 of the casing. However, the present invention is not limited to this configuration and the bottom of the casing may be secured to the top of the casing by any other configuration known in the art. Regardless of the method of coupling used, the top and bottom must be secured such that the PCB (including all necessary components) can fit within the enclosure of the casing and are not hindered from operation.

In the embodiment illustrated in FIG. 29 the bottom is configured to receive alternating current through a receptacle 54. Specifically, similar to the embodiments disclosed above, one embodiment of the two illustrated AC receptacles 33, 34 may be received within a through hole of the walls formed by the top and bottom halves of the casing 32. In further accordance with the foregoing, when the PCB 1 is received within the bottom half 35 of the casing 32, the AC contacts of position 11 may be aligned with or proximate to the receptacle 33, 34 and placed into electrical communication therewith by any means disclosed herein or understood in the art.

The PCB 1 is further in electrical communication with a DC power outlet. Specifically, similar to embodiments disclosed above, the DC outlet cable may be receive and/or permanently affixed to a wall of the frame/bottom half 29 by way of one or more through holes therethrough. As illustrated by the broken lines in FIG. 29, the DC outlet cable is placed into electrical communication with the contacts of the PCB 1 at position 10 such that the PCB 1 is placed into electrical communication with the DC outlet.

In each of the foregoing embodiments of the present invention, the PCB 1 is secured within the embodiment of the frame. The PCB 1 may be further placed into electrical communication with an AC inlet and an DC outlet such that the circuit of the switch mode power supply of the present invention is complete. To this end, and based on the foregoing, a single frame may be utilized with a single PCB 1 such that the frame and PCB 1 may be used for any application of switch mode power supply known in the art. As discussed above, this frame may be adapted to be secured within a chassis or rack mount configuration, a U-channel configuration, a wall mount configuration, a table top configuration, or the like. In each embodiment, the frame provides the structural support for the PCB such that only a single frame is necessary for each of these applications. However, as contemplated herein, the structure of the frame may be adapted to accommodate a specific configuration.

The present invention is, thereby, advantageous in that it lowers production costs for frame and PCB 1 in varying switch mode power supplies. More specifically, unlike what was known in the art, the present invention provides a single version of a frame and PCB 1 that is applicable across a wide range of applications/configurations. Thus, there is no longer a need to specifically design a PCB to fit into one particular package or mounting configuration. Rather, the frame of the present invention provides an apparatus interchangeable between different configurations. The present invention, therefore, is comprised of a design with equivalent optimization across each packaging structure. This, ultimately, leads to the reduction cost and complexity of variations within the product lines. This also leads to a decreased need for producing multiple circuit boards for each particular use.

We claim:

1. A mounting frame for mounting a printed circuit board within a switch mode power supply comprising:
   a) a base having four side walls forming an interior chamber sized to receive a printed circuit board;
   b) a plurality of mounting studs molded within the interior chamber such that the mounting studs support the printed circuit board within the base;
   c) a mounting extension extending from each of two opposing sides of the base:
   d) an AC input electrical connection and a DC output electrical connection each on one of the four side walls of the base; wherein the AC input electrical connection and DC output electrical connection each align with an AC input connection and DC output connection on the printed circuit board; wherein the AC input electrical connection and DC output electrical connection of the frame are comprised of metallic clips.

2. The mounting frame of claim 1 wherein the AC input connection and DC output connection on the printed circuit board are both independently comprised of contact pads adapted to slidingly engaged with the metallic clips of the AC input electrical connection and the DC output electrical connection on at least one of the four side walls of the base.

3. The mounting frame of claim 1 wherein the AC input connection and DC output connection on the printed circuit board are both independently comprised of pin header type electrical connections adapted to slidingly engaged with the metallic clips of the AC input electrical connection and the DC output electrical connection on at least one of the four side walls of the base.

4. A mounting frame for mounting a printed circuit board on a chassis of a switch mode power supply comprising:
   a base having four side walls forming an interior chamber sized to receive a printed circuit board;
   a plurality of mounting studs molded within the interior chamber such that the mounting studs support the printed circuit board within the base;
   an AC input electrical connection on one of the four side walls of the base wherein the AC input electrical connection aligns with similarly placed AC input connection on the printed circuit board;
   a DC output electrical connection on one of the four side walls of the base wherein the DC output connection aligns with similarly placed DC output connection on the printed circuit board;
   a mounting extension extending from each of two opposing sides of the base.

5. The mounting frame of claim 4 wherein the mounting extension is comprised of two opposing side walls and a bottom wall with a recess passing therebetween wherein a plurality first mounting holes are horizontally oriented and pass through the two opposing side walls of the mounting extension such that the base may be vertically coupled to the chassis of a switch mode power supply.

6. The mounting frame of claim 4 wherein the mounting extension is comprised of two opposing side walls and a bottom wall with a recess passing therebetween wherein a plurality of second mounting holes are vertically oriented and pass through opposing ends of the bottom wall such that the base may be horizontally coupled to the chassis of a switch mode power supply.

7. A mounting frame of claim 4 wherein the mounting extension is comprised of two opposing side walls and a bottom wall with a recess passing therebetween wherein a plurality first mounting studs extend horizontally from the two opposing side walls such that the base may be coupled to the chassis of a switch mode power supply.

8. The mounting frame of claim 4 further comprising a plurality of clips integrally mounted within at least one of the four side walls of the base wherein the plurality of clips couple the printed circuit board to the base.

9. The mounting frame of claim 4 further comprising a plurality of first mounting holes extending through at least one of the four side walls of the base wherein the mounting holes couple the base to an element of a switch mode power supply.

10. The mounting frame of claim 9 wherein the plurality of first mounting holes are positioned on the base such that the base and printed circuit board are coupled to the switch mode power supply by one of the four side walls of the base.

11. The mounting frame of claim 9 wherein the plurality of first mounting holes are positioned on the base such that the base and printed circuit board are coupled to the switch mode power supply by all four side walls of the base.

12. The mounting frame of claim 4 further comprising a bottom wall molded to the four side walls of the base.

13. The mounting frame of claim 12 wherein the bottom wall is coated with an electrically conductive material.

14. The mounting frame of claim 12 wherein the bottom wall is coupled to a metallic foil.

15. The mounting frame of claim 12 wherein the four side walls and the bottom wall form one half of the switch mode power supply.

16. The mounting frame of claim 14 wherein the AC input electrical connection and the DC output electrical connection on at least one of the four side walls of the base is comprised of a metallic clip.

17. The mounting frame of claim 16 wherein the similarly placed AC input connection and DC output connection on the printed circuit board are both comprised of contact pads adapted to slidingly engaged with the metallic clips of the AC input electrical connection and the DC output electrical connection on at least one of the four side walls of the base.

18. The mounting frame of claim 16 wherein the similarly placed AC input connection and DC output connection on the printed circuit board are both comprised of pin header type electrical connections adapted to slidingly engaged with the metallic clips of the AC input electrical connection and the DC output electrical connection on at least one of the four side walls of the base.

19. The mounting frame of claim 4 wherein the base is mountable to one or more rails by way of one or more brackets.

20. The mounting frame of claim 4 wherein one side of the four walls of the base recessed so as to from a slot that is receivable by one or more rails.

21. A mounting frame for mounting a printed circuit board within a switch mode power supply comprising:
  a base having four side walls and a bottom wall forming an interior chamber sized to receive a printed circuit board;
  a plurality of mounting studs molded within the interior chamber such that the mounting studs support the printed circuit board within the base;
  an AC input electrical connection coupled to one of the four side walls of the base wherein the AC input electrical connection is in electrical communication with an AC input connection on the printed circuit board;
  a DC output electrical connection coupled to one of the four side walls of the base wherein the DC output connection is in electrical connection with a DC output connection on the printed circuit board; and
  a cover comprising four side walls and a ceiling wherein the cover is received by the base such that the base and cover enclose the printed circuit board therein.

22. A mounting frame for mounting a printed circuit board within a switch mode power supply comprising:
  a base having four side walls and a bottom wall forming an interior chamber sized to receive a printed circuit board;
  a plurality of mounting studs molded within the interior chamber such that the mounting studs support the printed circuit board within the base;
  an AC input electrical connection coupled to one of the four side walls of the base wherein the AC input electrical connection is in electrical communication with an AC input connection on the printed circuit board;
  a DC output electrical connection coupled to one of the four side walls of the base wherein the DC output connection is in electrical connection with a DC output connection on the printed circuit board;
  a tray comprised of four side walls and a floor wherein the tray is sized to receive the base; and
  a cover comprising four side walls and a ceiling wherein the cover is received by the tray such that the tray and cover enclose the base and printed circuit board therein.

* * * * *